United States Patent
Umeda et al.

(10) Patent No.: US 11,211,311 B2
(45) Date of Patent: Dec. 28, 2021

(54) ELECTRONIC DEVICE AND CONNECTION BODY

(71) Applicant: SHINDENGEN ELECTRIC MANUFACTURING CO., LTD., Tokyo (JP)

(72) Inventors: Soichiro Umeda, Hanno (JP); Yuji Morinaga, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 101 days.

(21) Appl. No.: 16/468,261

(22) PCT Filed: Feb. 20, 2017

(86) PCT No.: PCT/JP2017/006025
§ 371 (c)(1),
(2) Date: Jun. 10, 2019

(87) PCT Pub. No.: WO2018/150555
PCT Pub. Date: Aug. 23, 2018

(65) Prior Publication Data
US 2020/0011904 A1    Jan. 9, 2020

(51) Int. Cl.
*H01L 23/495* (2006.01)
*H01L 23/31* (2006.01)
(Continued)

(52) U.S. Cl.
CPC .... *H01L 23/49541* (2013.01); *G01R 19/0092* (2013.01); *H01L 23/3121* (2013.01);
(Continued)

(58) Field of Classification Search
CPC .......... H01L 23/4951; H01L 23/49513; H01L 23/49524; H01L 23/49541; H01L 23/49548–23/49555; H01L 23/49562
See application file for complete search history.

(56) References Cited

U.S. PATENT DOCUMENTS 6,249,041 B1    6/2001  Kasem et al.
6,307,755 B1 * 10/2001  Williams ............ H01L 23/4334
                                                    361/813
(Continued)

FOREIGN PATENT DOCUMENTS

CN    1360814 A    7/2002
CN    103715161 A    4/2014
(Continued)

OTHER PUBLICATIONS

Sedra-Smith, Microelectronic Circuits, 2004, Oxford University Press, Fifth Edition, pp. 239, 240, 247 (Year: 2004).*
(Continued)

*Primary Examiner* — Zandra V Smith
*Assistant Examiner* — Molly K Reida
(74) *Attorney, Agent, or Firm* — Ladas & Parry, LLP

(57) ABSTRACT

An electronic device has a sealing part 90, a first main terminal 11 protruding outward from the sealing part 90, a second main terminal 12 protruding outwardly from the sealing part, an electronic element 95 provided in the sealing part and having a front surface electrically connected to the first main terminal 11 and a back surface electrically connected to the second main terminal 12, a head part 40 connected to the front surface of the electronic element 95, a sensing terminal 13 protruding to an outside from the sealing part 90 and used for sensing and a connection part 35 integrally formed with the head part 40 and electrically connected to the sensing terminal 13. A current flowing through the sensing terminal 13 and the connection part 35

(Continued)

among a sensing current path does not overlap a main current path flowing through the second main terminal 12, the electronic element 95 and the first main terminal 11.

5 Claims, 9 Drawing Sheets

(51) Int. Cl.
  *H01L 23/498* (2006.01)
  *G01R 19/00* (2006.01)
(52) U.S. Cl.
  CPC .... *H01L 23/4951* (2013.01); *H01L 23/49562* (2013.01); *H01L 23/49811* (2013.01); *H01L 23/49524* (2013.01)

(56) References Cited

U.S. PATENT DOCUMENTS

| | | | |
|---|---|---|---|
| 2008/0224315 | A1 | 9/2008 | Miyata et al. |
| 2012/0306299 | A1 | 12/2012 | Masuzawa et al. |
| 2013/0241047 | A1 | 9/2013 | Omae et al. |
| 2014/0097528 | A1* | 4/2014 | Otremba ............... H01L 24/40 257/676 |

FOREIGN PATENT DOCUMENTS

| | | |
|---|---|---|
| JP | H 07245401 A | 9/1995 |
| JP | H 10294473 A | 11/1998 |
| JP | H 11354702 A | 12/1999 |
| JP | 2009071064 A | 4/2009 |
| JP | 2012-249457 A | 12/2012 |
| JP | 2013004943 A | 1/2013 |
| JP | 2016157786 A | 9/2016 |
| WO | 2012/127696 A1 | 9/2012 |

OTHER PUBLICATIONS

Japanese Patent Application No. 2018-517911, Decision to grant patent dated Mar. 28, 2019.
International Search Report for PCT/JP2017/006025 dated May 16, 2017 and its English translation from WIPO.
Written Opinion of the International Searching Authority for PCT/JP2017/006025 dated May 16, 2017 and its English translation from Google Translate.
Extended European Search Repot from EP app. No. 17896713.9, dated Oct. 15, 2020.
International Preliminary Report on Patentability from PCT/JP2017/006025, dated Aug. 23, 2018, with English translation from WIPO.
First Office Action from CN app. No. 201780081394.X, dated Dec. 16, 2020, with machine English translation from Google Translate.

* cited by examiner

ELECTRONIC DEVICE AND CONNECTION BODY

CROSS-REFERENCE TO RELATED APPLICATION

The present application is the U.S. national phase of PCT Application PCT/JP2017/006025 filed on Feb. 20, 2017, the disclosure of which is incorporated herein by reference in its entirety.

TECHNICAL FIELD

The present invention relates to an electronic device and a connection body.

BACKGROUND ART

Conventionally, it has been known to mount a semiconductor element on a conductive layer of a substrate and connect a front surface of the semiconductor element and a terminal with a wire or a connector via a solder. In addition, a sensing terminal may be used to detect a voltage in a semiconductor element (Japanese Patent Application Laid-Open No. H7-245401). Since such a sensing terminal is connected to the conductive layer connected to a proximal end part of the connector, a sensing current path for measuring the voltage of the semiconductor element and a current path flowing through the semiconductor element partially overlap, and voltage drop corresponding to a wiring resistance of the connector affects the voltage detected at the sensing terminal.

SUMMARY OF INVENTION

Technical Problem

In view of the above, the present invention provides an electronic device and a connection body capable of detecting an accurate voltage of an electronic element without being affected by a wiring resistance as much as possible.

Solution to Problem

An electronic device according to an example of the invention comprises:
 a sealing part;
 a first main terminal protruding outward from the sealing part;
 a second main terminal protruding outwardly from the sealing part;
 an electronic element provided in the sealing part and having a front surface electrically connected to the first main terminal and a back surface electrically connected to the second main terminal;
 a head part connected to the front surface of the electronic element;
 a sensing terminal protruding to an outside from the sealing part and used for sensing; and
 a connection part integrally formed with the head part and electrically connected to the sensing terminal, wherein
 a current flowing through the sensing terminal and the connection part among a sensing current path does not overlap a main current path flowing through the second main terminal, the electronic element and the first main terminal.

In the electronic device according to an example of the invention,
 the sensing terminal and the connection part may be integrally formed with the head part.

In the electronic device according to an example of the invention,
 the first main terminal and the head part may be integrally formed.

The electronic device, according to an example of the invention, may further comprise
 a proximal end part formed integrally with the head part and connected to a conductive layer in the sealing part.

The electronic device, according to an example of the invention, may further comprise
 the electronic element has a withstand voltage structure,
 the electronic device further comprises an avoidance part, formed integrally with the head part, for avoiding contact with the withstand voltage structure.

A connection body, according to an example of the invention, is a connection body used for an electronic device having a sealing part, a first main terminal protruding outward from the sealing part, a second main terminal protruding outwardly from the sealing part and an electronic element provided in the sealing part and having a front surface electrically connected to the first main terminal and a back surface electrically connected to the second main terminal, the connection body comprises:
 a head part connected to the front surface of the electronic element; and
 a connection part integrally formed with the head part and electrically connected to a sensing terminal protruding to an outside from the sealing part and used for sensing, wherein
 a current flowing through the connection part among a sensing current path does not overlap a main current path flowing through the second main terminal, the electronic element and the first main terminal.

Advantageous Effects of Invention

According to the present invention, since the head part and the connection part are integrally formed, an influence of a wiring resistance can be prevented as much as possible. The current flowing through the connection part among the sensing current path does not overlap with the main current path through the first main terminal, the electronic element and the second main terminal, and therefore, it is also possible to prevent an influence of the wiring resistance caused by the main current path. Therefore, the voltage of the electronic element can be detected more accurately.

DESCRIPTION OF EMBODIMENTS

First Embodiment

<<Configuration>>

Figure 1:
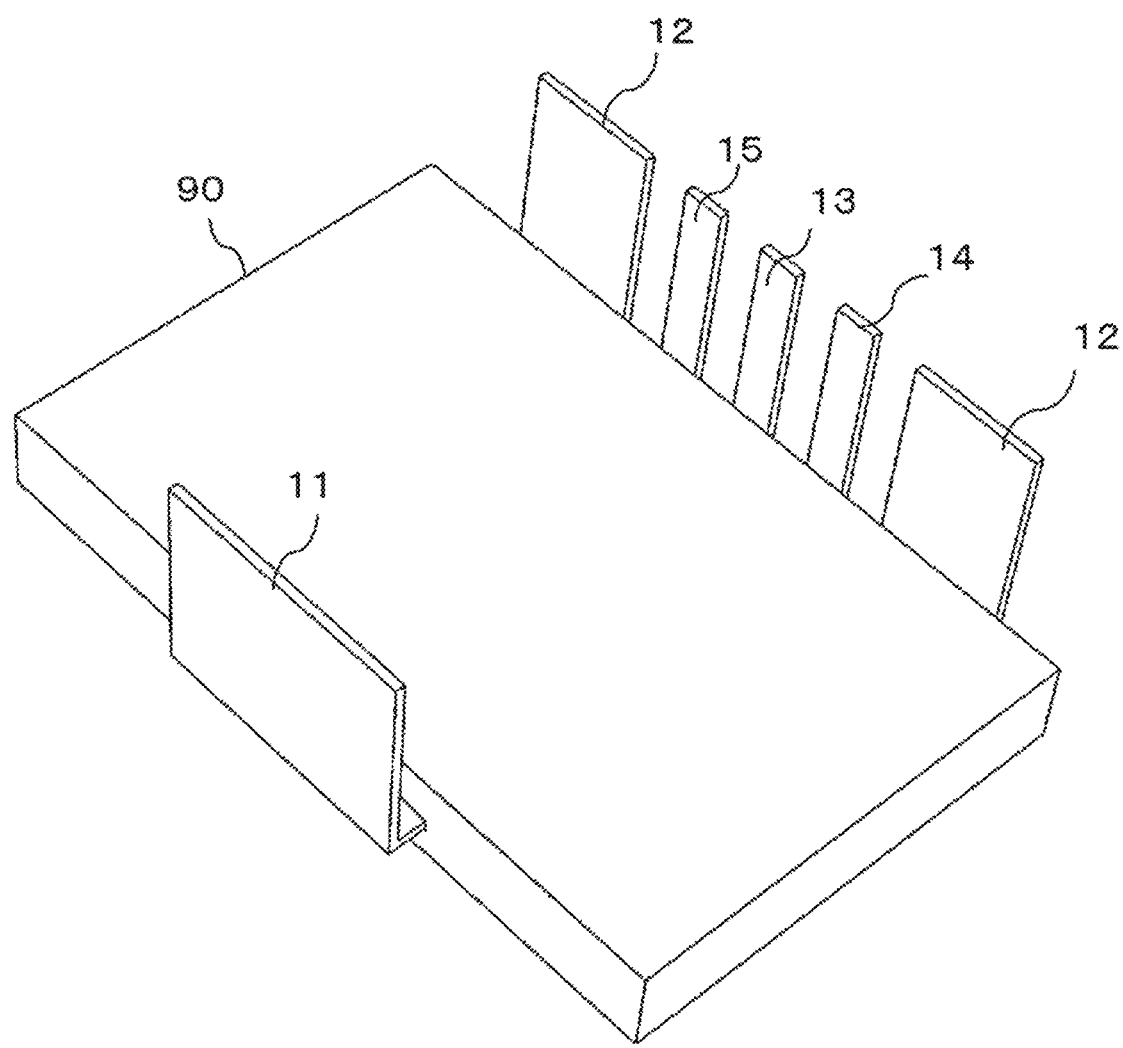
FIG. 1 is a perspective view of a semiconductor device according to a first embodiment of the present invention.
Figure 2:
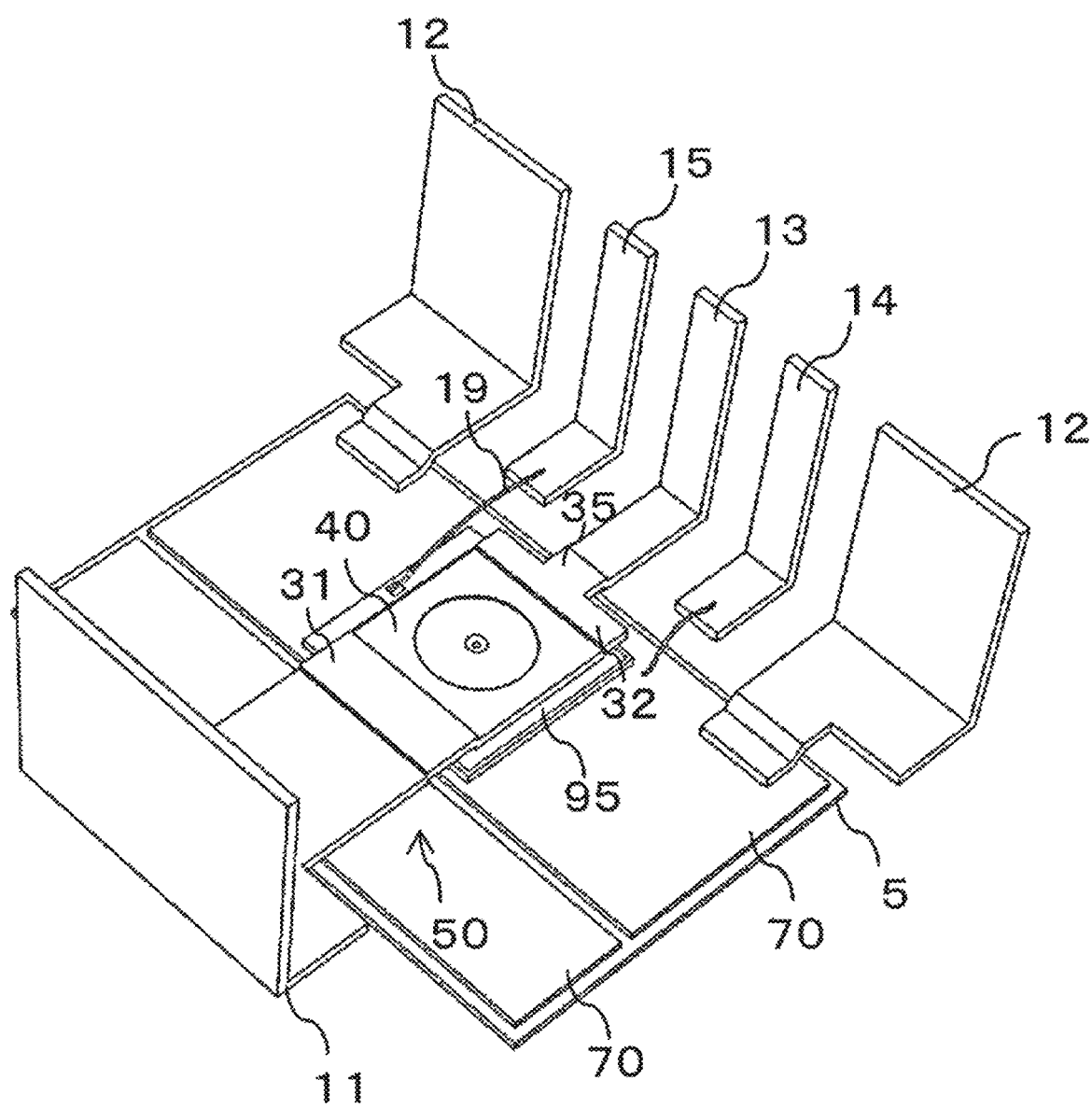
FIG. 2 is a perspective view showing an aspect in which a sealing part is removed in the semiconductor device according to the first embodiment of the present invention.
Figure 5:
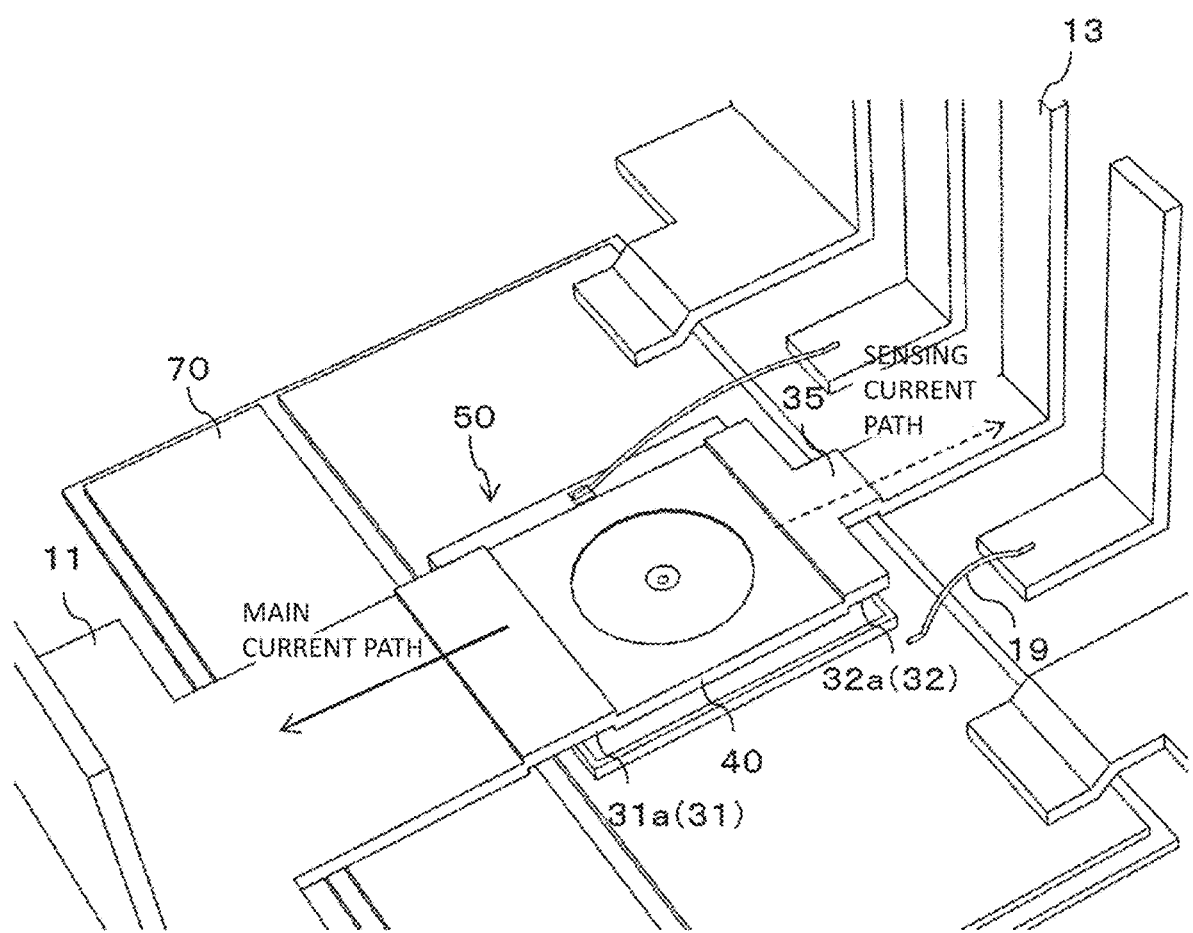
FIG. 5 is an enlarged perspective view of the aspect shown in FIG. 2.

As shown in FIG. 1, a semiconductor device, which is an example of an electronic device according to the present embodiment, has a sealing part 90 being a sealing resin, a first main terminal 11 protruding outward from the sealing part 90, and a second main terminal 12 protruding outwardly from the sealing part 90. As shown in FIG. 2, the semiconductor device has a semiconductor element 95 provided in the sealing part 90, the semiconductor element 95 having a front surface electrically connected to the first main terminal 11 and a back surface electrically connected to the second main terminal 12, a head part 40 connected to the front surface of the semiconductor element 95, a sensing terminal 13 of front surface side (hereinafter referred to as a "front surface side sensing terminal 13") protruding to the outside from the sealing part 90 and used for sensing on a source side, and a connection part 35 integrally formed with the head part 40 and electrically connected to the front surface side sensing terminal 13. Among sensing current paths, a path of a current flowing through the front surface side sensing terminal 13 and the connection part 35 does not overlap a main current path flowing through the second main terminal 12, the semiconductor element 95, and the first main terminal 11 (See FIG. 5). In the present embodiment, explanation will be made by use of the first main terminal 11 through which a main current flows as a first terminal and the front surface side sensing terminal 13 through which the main current flows as a second terminal, but the present invention is not limited to this configuration. It is possible to adopt an aspect in which the main current does not flow through the first terminal or use an aspect in which the second terminal is not used for sensing.

In the present embodiment, the semiconductor device is used as the electronic device and the semiconductor element 95 is used as the electronic element, but the present invention is not limited to this configuration, and the embodiment is not particularly necessary to be a "semiconductor".

Figure 4:
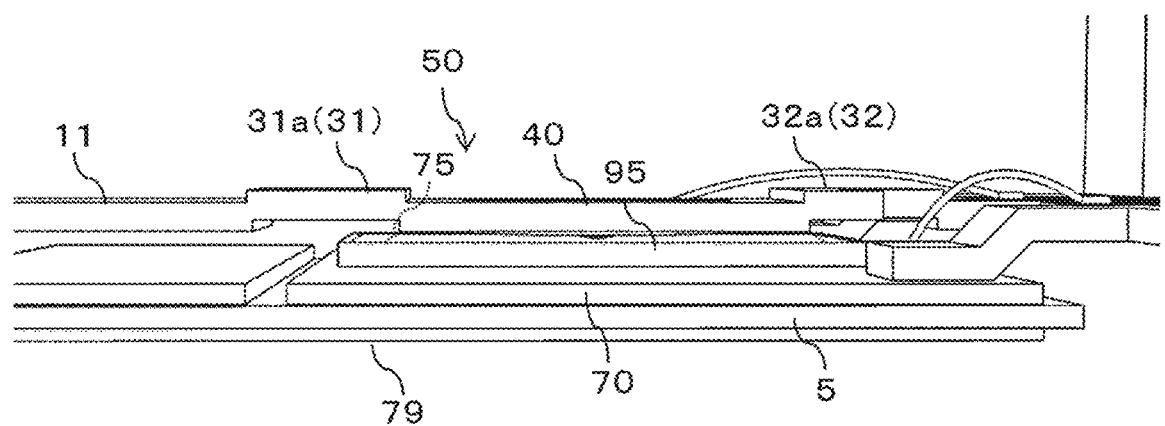
FIG. 4 is a side view obtained by enlarging FIG. 3.

As shown in FIG. 2, the semiconductor device may have, for example, a substrate 5 including an insulating material, and a conductive layer 70 provided on the substrate 5 and including copper. As shown in FIG. 4, a heat sink 79 including copper may be provided on a back surface of the substrate 5.

In the aspect shown in FIG. 2, the second main terminal 12 is connected to the conductive layer 70, and the second main terminal 12 is connected to the back surface of the semiconductor element 95 via the conductive layer 70. A resist (not shown) may be provided on a periphery of a connection point of the second main terminal 12 with the conductive layer 70 to prevent a conductive adhesive such as solder from flowing out. The back surface of the semiconductor element 95 and the conductive layer 70 may be connected via the conductive adhesive such as solder. The head part 40 and the front surface of the semiconductor element 95 may also be connected via a conductive adhesive 75 such as solder (see FIG. 4).

Figure 3:
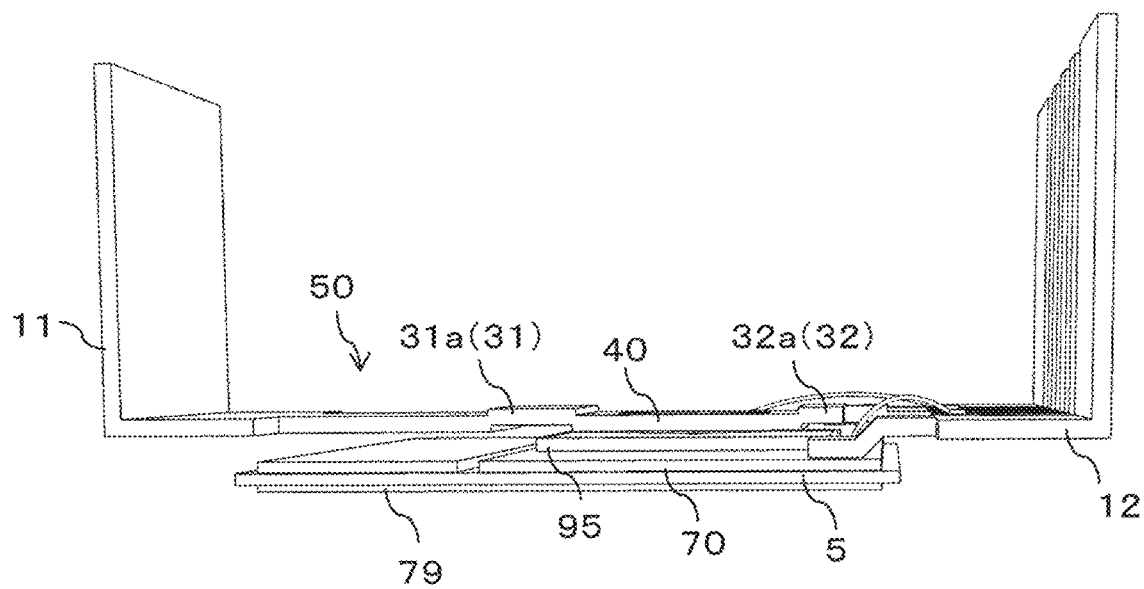
FIG. 3 is a side view of the aspect shown in FIG. 2 as seen from a side.

The semiconductor element 95 may have a withstand voltage structure such as a guard ring. When the semiconductor element 95 has such a withstand voltage structure, avoidance parts 31, 32, formed integrally with the head part 40, for avoiding contact with the withstand voltage structure may be provided as shown in FIG. 3. Such avoidance parts 31, 32 are provided corresponding to the withstand voltage structure of the semiconductor element 95, and are designed in advance based on an arrangement position of the withstand voltage structure such as a guard ring, a thickness in a horizontal direction, and the like.

The avoidance parts 31, 32 may have a first avoidance part 31 provided between the first main terminal 11 and the head part 40, and a second avoidance part 32 provided between the front surface side sensing terminal 13 and the head part 40. The first avoidance part 31 may be a first recess part 31a recessed to be away from the semiconductor element 95, and the second avoidance part 32 may be a second recess part 32a recessed to be away from the semiconductor element 95. Note that, in FIG. 7, an aspect in which a recess part is not used is shown.

The first main terminal 11 and the second main terminal 12 may be power terminals through which a large current flows. The main current path is formed so as to pass through the second main terminal 12, the conductive layer 70, the back surface and the front surface of the semiconductor element 95, the head part 40, the first avoidance part 31, and the first main terminal 11 (see FIG. 2). On the other hand, a sensing current path is formed so as to pass through the front surface of the semiconductor element 95, the head part 40, the second avoidance part 32, the connection part 35, and the front surface side sensing terminal 13. On one hand, the current flowing from the front surface of the semiconductor element 95 to the head part 40 passes through the first avoidance part 31 and the first main terminal 11 along the main current path, and on the other hand passes through the second avoidance part 32, the connection part 35, and the front surface side sensing terminal 13 along the sensing current path.

Figure 8:
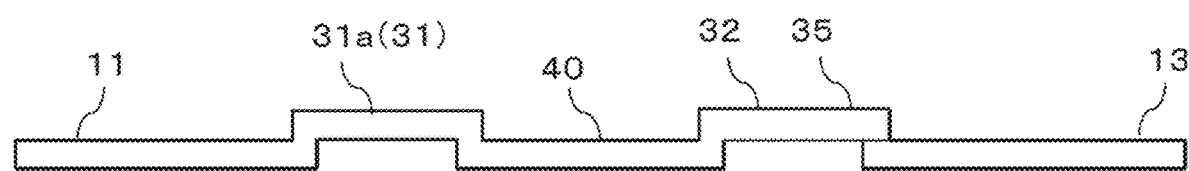
FIG. 8 is a side view showing an aspect in which a connection part and a front surface side sensing terminal are separate.

As shown in FIG. 2, the front surface side sensing terminal 13 and the connection part 35 may be integrally formed with the head part 40. However, the present invention is not limited to this configuration. For example, as shown in FIG. 8, the connection part 35 and the head part 40 may be integrally formed, but the connection part 35 and the front surface side sensing terminal 13 may be formed separately. As an example, a back surface of the connection part 35 may be electrically connected to a front surface of the front surface side sensing terminal 13 via a conductive adhesive or the like.

As shown in FIG. 2, the first main terminal 11 and the head part 40 may be integrally formed. In the case where the first main terminal 11 and the head part 40 are integrally formed, as shown in FIGS. 3 and 4, the first main terminal 11 may not be connected to the conductive layer 70, but may be provided away from the conductive layer 70. In this aspect, the conductive layer 70 may not be provided under the first main terminal 11, or the first avoidance part 31 may be exposed from a side surface of the sealing part 90 to the outside in the middle of the first avoidance part 31, or immediately after the first avoidance part 31, the first main terminal 11 may be exposed to the outside from the side surface of the sealing part 90.

Figure 7:
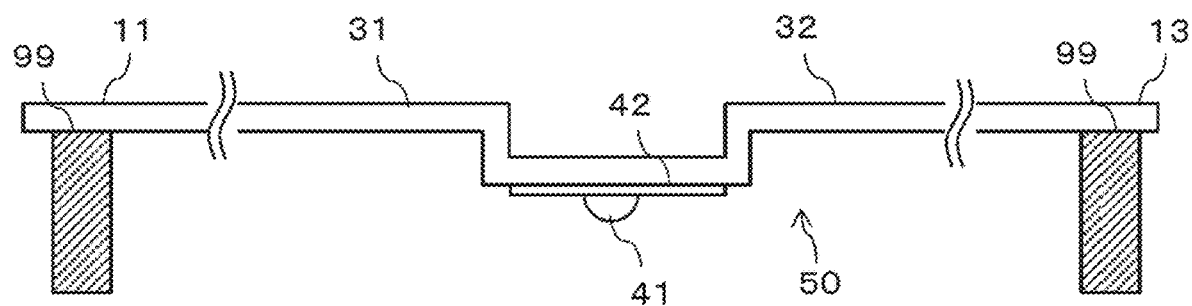
FIG. 7 is a side view showing an aspect in which a connection body is installed by use of a jig in the first embodiment of the present invention.

In the case where the first main terminal 11 and the head part 40 are integrally formed, and the front surface side sensing terminal 13, the connection part 35, and the head part 40 are integrally formed, as shown in FIGS. 3 and 7, a back surface side height of the first main terminal 11 and a back surface side height of the front surface side sensing terminal 13 may correspond to each other. Here, the fact that the heights correspond to each other means a match within 10% of a thickness of the thicker one of the first main terminal 11 and the front surface side sensing terminal 13. When thicknesses $T_0$ of the first main terminal 11 and the front surface side sensing terminal 13 are the same, deviation between the back surface side height of the first main terminal 11 and the back surface side height of the second main terminal 12 is within 10% of the thickness $T_0$, which means that it is within $0.1T_0$. When the thicknesses of the first main terminal 11 and the front surface side sensing terminal 13 are different, it is within 10% of a thickness $T_1$ of the thicker one, which means that it is within $0.1T_1$. The back surface side height of the first main terminal 11 and the back surface side height of the front surface side sensing terminal 13 may match. In the case of the match, it means that the deviation between the back surface side height of the first main terminal 11 and the back surface side height of the front surface side sensing terminal 13 is within a manufacturing error range.

When the first main terminal 11 and the head part 40 are integrally formed and the connection part 35 and the head part 40 are integrally formed, the back surface side height of the first main terminal 11 and the back surface side height of the front surface side sensing terminal 13 coupled with the connection part 35 may correspond (see FIG. 8). Here, similarly to the aspect explained above, the fact that the heights correspond to each other means a match within 10% of the thickness of the thicker one of the first main terminal 11 and the front surface side sensing terminal 13. The back surface side height of the first main terminal 11 and the back surface side height of the front surface side sensing terminal 13 may match. In the case of the match, it means that the deviation between the back surface side height of the first main terminal 11 and the back surface side height of the front surface side sensing terminal 13 is within the manufacturing error range. In the present embodiment, "coupled" also includes an aspect in a form of "integrated".

As shown in FIG. 2 and FIG. 3, the front surface side sensing terminal 13, the connection part 35, and the first main terminal 11 may extend in an opposite direction from the head part 40. In this case, the first main terminal 11 and the front surface side sensing terminal 13 may be used as jig receivers for receiving a jig 99 (FIG. 7). However, the front surface side sensing terminal 13, the connection part 35, and the first main terminal 11 may extend in different directions as viewed from the head part 40, and the present invention is not limited to this configuration. For example, the front surface side sensing terminal 13, the connection part 35, and the first main terminal 11 may extend to form an angle of 90 degrees or an angle greater than 90 degrees (obtuse angle).

Figure 6:
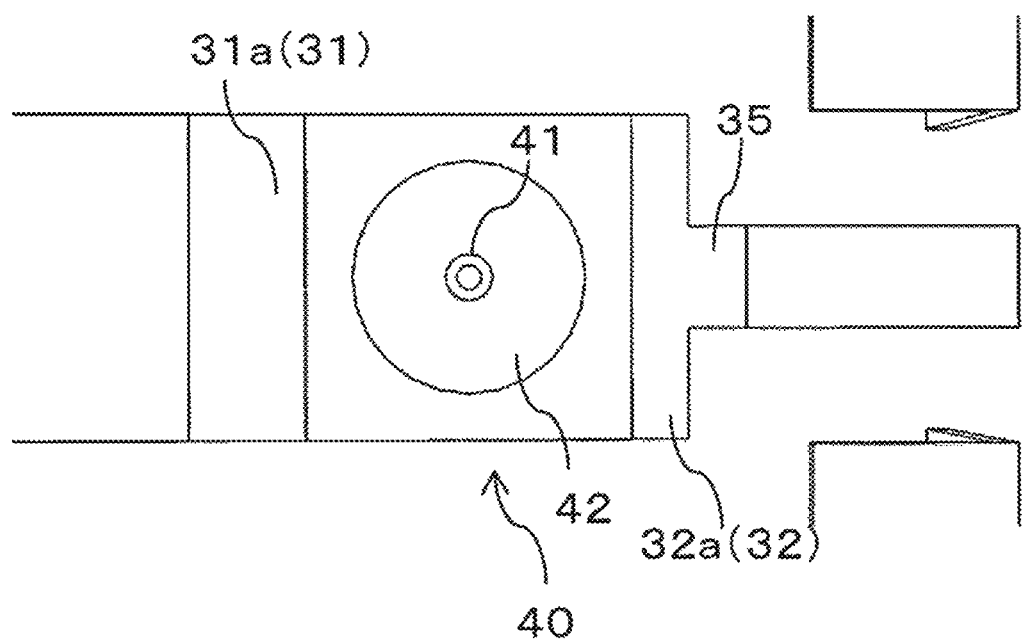
FIG. 6 is a bottom view showing a relationship of a head part, an avoidance part, and the like used in the first embodiment of the present invention.

As shown in FIG. 6, the head part 40 may have a second protrusion unit 42 protruding toward a side of the semiconductor element 95 and a first protrusion unit 41 protruding from the second protrusion unit 42 toward the side of the semiconductor element 95.

In the aspect shown in FIG. 2, as an example, widths of the first avoidance part 31, the head part 40, and the second avoidance part 32 are larger than widths of the front surface side sensing terminal 13 and the connection part 35, and widths of the first main terminal 11 and the second main terminal 12 are larger than the widths of the first avoidance part 31, the head part 40, and the second avoidance part 32.

Through the sensing current path, there is no need to pass a large current, so the widths of the second avoidance part 32, the connection part 35, and the front surface side sensing terminal 13 may be narrow. As an example, the width of each of the second avoidance part 32, the connection part 35, and the front surface side sensing terminal 13 may be narrowed to be one-third or less or one-fifth or less of the width of the head part 40. Note that, in the aspect shown in FIG. 2, the width of the second avoidance part 32 on a side of the head part is large, but the present invention is not limited to this aspect. As shown in FIG. 2, by making the width on the side of the head part of the second avoidance part 32 larger and making the width on the side of the head part side correspond to the width of the head part 40, the width of the planar shape head part 40 of the second avoidance part 32 can be surely secured. That is, when the head part 40, the second avoidance part 32, and the like are formed, it is conceivable to punch out a conductive member such as a copper plate, but from a viewpoint of ensuring the width of the head part 40, it is preferable to set the width of the second avoidance part 32 adjacent to the head part 40 to be approximately equal to the width of the head part 40. On the other hand, when sacrificing the width of the head part 40 to some extent, it is also conceivable to narrow the entire width of the second avoidance part 32.

In the aspect shown in FIG. 1, the second main terminal 12, the front surface side sensing terminal 13, a back surface side sensing terminal 14 and a control terminal 15 protrude from the outside from one side surface of the sealing part 90, and the first main terminal 11 protrudes outward from the other side surface of the sealing part 90. The first main terminal 11, the second main terminal 12, the front surface side sensing terminal 13, the back surface side sensing terminal 14, and the control terminal 15 are bent to a front surface side, and are connected to a control substrate (not shown) provided on the front surface side. This control substrate is used to control the semiconductor element 95.

A structure within the sealing part 90 of the semiconductor device may be line symmetrical. As an example, each of the first main terminal 11, the second main terminal 12, the front surface side sensing terminal 13, the back surface side sensing terminal 14, the control terminal 15, and the conductive layer 70 may be arranged to be axisymmetric with respect to an arbitrary straight line. A wire 19 is also shown in FIG. 2.

<<Operations and Effects>>

Next, operations and effects according to the present embodiment having the above configuration will be explained.

According to the present embodiment, since the head part 40 and the connection part 35 are integrally formed, an influence of a wiring resistance can be prevented as much as possible. In addition, the currents flowing through the front surface side sensing terminal 13 and the connection part 35 among the sensing current path do not overlap with the main current path through the first main terminal 11, the semiconductor element 95 and the second main terminal 12 (See FIG. 5), and therefore, it is also possible to prevent an influence of the wiring resistance caused by the main current path. Therefore, the voltage of the semiconductor element 95 can be detected more accurately.

In the conventional configuration, the front surface side sensing terminal 13 for detecting the voltage at the semiconductor element 95 is connected to the conductive layer 70 connected to a proximal end part of a connector, and therefore, both of the sensing current path for measuring the voltage of the semiconductor element 95 and the current path flowing through the semiconductor element 95 pass through at least the same connector, and voltage drop of the wiring resistance of the connector affects the voltage detected by the front surface side sensing terminal 13. In contrast, according to the present embodiment, on one hand, the current flowing from the front surface of the semiconductor element 95 to the head part 40 passes through the first avoidance part 31 and the first main terminal 11 along the main current path, and on the other hand, passes through the second avoidance part 32, the connection part 35, and the front surface side sensing terminal 13 along the sensing current path. Therefore, the voltage of the semiconductor element 95 detected by the front surface side sensing terminal 13 is detected as a more accurate value.

Note that, when a large current (for example, 200 A to 300 A or more) flows through the first main terminal 11 and the second main terminal 12, the influence of the voltage drop due to the wiring resistance becomes large. Therefore, when such a large current flows, it is very useful to adopt the aspect of the present embodiment.

As shown in FIG. 2 and the like, when adopting the aspect in which the front surface side sensing terminal 13, the connection part 35, and the head part 40 are integrally formed, the front surface side sensing terminal 13, the connection part 35, and the head part 40 can integrally include the same material, and therefore, the voltage to be detected is not affected by a connection mode unlike the case where the front surface side sensing terminal 13, the connection part 35, and the head part 40 are separated. Therefore, it is advantageous in that the voltage can be detected more accurately by the front surface side sensing terminal 13.

As shown in FIG. 8, even in the case where the head part 40 and the connection part 35 are integrally formed and the connection part 35 and the front surface side sensing terminal 13 are separately formed, when the connection part 35 and the front surface side sensing terminal 13 are connected without passing through the conductive layer 70, the voltage to be detected is not affected by connection modes between the connection part 35 and the conductive layer 70 and between the front surface side sensing terminal 13 and the conductive layer 70. Therefore, it is advantageous in that the voltage can be accurately detected by the front surface side sensing terminal 13.

When the first main terminal 11 and the head part 40 are integrally formed, the conductive layer 70 for connecting to the first main terminal 11 is unnecessary, and the conductive layer 70 may not be provided on a back surface side of the first main terminal 11. In the case where the conductive layer 70 is not provided in this manner, the manufacturing cost can be reduced. In the case where the first main terminal 11 and the head part 40 are integrally formed, it is possible to expose the terminal outward from the side surface of the sealing part 90 without passing through the conductive layer 70. Therefore, it can be expected that a size in an in-plane direction is reduced due to absence of the conductive layer 70. Note that, in the conventional configuration, the front surface side sensing terminal 13 for detecting the voltage in the semiconductor element 95 is connected to the conductive layer 70 connected to the proximal end part of the connector, and therefore, it is necessary to provide such the conductive layer 70.

In the case where the semiconductor element 95 has the withstand voltage structure, and the avoidance parts 31, 32 formed integrally with the head part 40 for avoiding contact with the withstand voltage structure are provided (see FIG. 4 and the like), it is possible to prevent electrical connection between the withstand voltage structure of the semiconductor element 95 and a connection body 50. In this aspect, as shown in FIG. 2 and the like, when adopting the aspect in which the connection part 35 is integrally formed with the front surface side sensing terminal 13, the second avoidance part 32, and the head part 40, members between the head part 40 and the front surface side sensing terminal 13 can be integrally formed, and there is no change in the current flowing by the connection mode unlike a case where any one of them is separated. Therefore, the voltage or current can be detected more accurately by the front surface side sensing terminal 13.

Second Embodiment

Next, a second embodiment of the present invention will be described.

Figure 9:
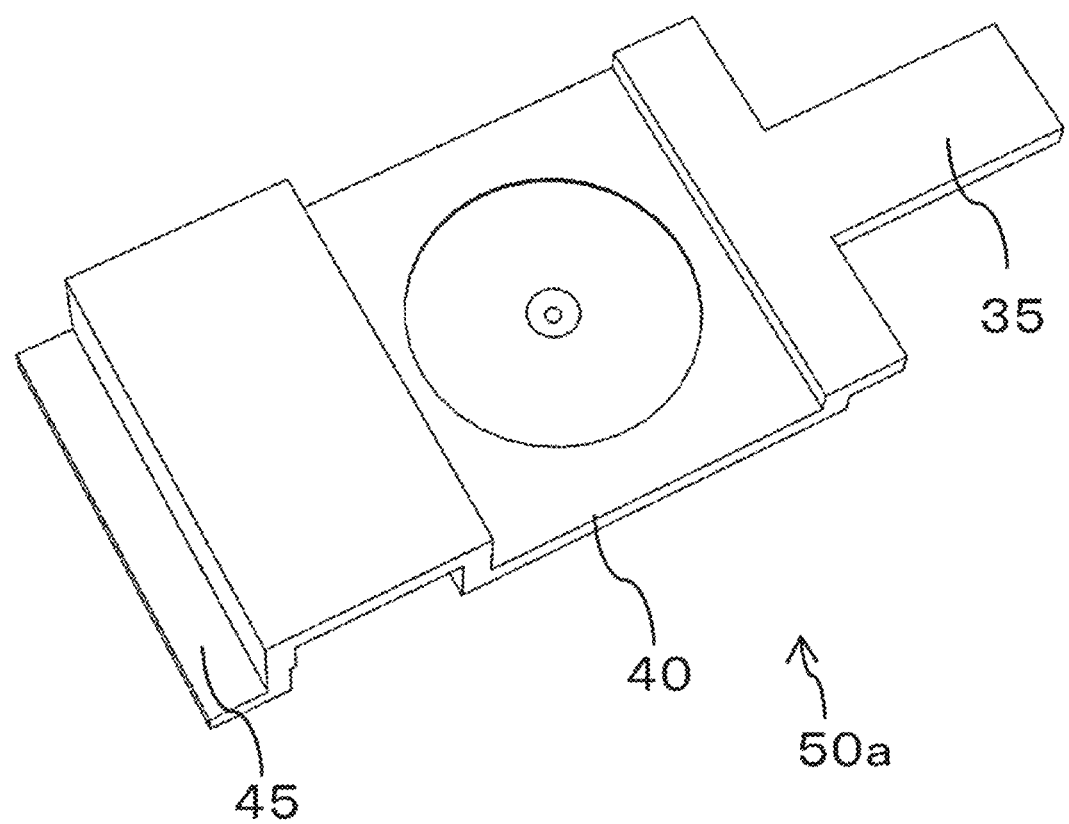
FIG. 9 is a perspective view showing a connection body used in a second embodiment of the present invention.

In the first embodiment, the explanation was made by use of the aspect in which the head part 40 and the first main terminal 11 are integrally formed. As shown in FIG. 9, a connection body 50a according to the second embodiment is separate from a first main terminal 11 and a head part 40. In the present embodiment, a proximal end part 45 is formed integrally with the head part 40 and connected to a conductive layer 70 in a sealing part 90.

The configuration other than the above is similar to that in the first embodiment. In the second embodiment, the same or similar members or the like as those in the first embodiment are denoted with the same reference numerals, and description thereof is omitted. In the present embodiment, with the exception of the effect obtained in the case where the head part 40 and the first main terminal 11 are integrally formed, the effect similar to the effect achieved by the first embodiment can be obtained.

Lastly, the description of each embodiment described above, the description of the modification, and the disclosure of the drawings are merely examples for explaining the invention described in the claims, and the invention described in the claims is not limited by the description of the above-mentioned embodiment or the disclosure of the drawings. In addition, the description of the claims as filed is merely an example, and the description of the claims can be appropriately changed based on the description of the specification, the drawings, and the like.

REFERENCE SIGNS LIST

11 first main terminal
12 second main terminal
13 front surface side sensing terminal
31 first avoidance part
32 second avoidance part
35 connection part
40 head part
50, 50a connection body
70 conductive layer
75 conductive adhesive
90 sealing part
95 semiconductor element (electronic element)

The invention claimed is:

1. An electronic device comprising:
a substrate;
a conductive layer provided on the substrate;
an electronic element provided on the conductive layer;
a connection body connected to a front surface of the electronic element via a conductive adhesive;
a first main terminal electrically connected to the front surface of the electronic element via the connection body;

a second main terminal connected to the conductive layer;

a sensing terminal for detecting a voltage of the front surface of the electronic element; and a sealing part sealing the conductive layer, the electronic element and the connection body inside, wherein the connection body has a head part connected to the front surface of the electronic element, the first main terminal is connected to the head part and is integrally formed with the connection body, the sensing terminal extends from the head part in an opposite direction to the first main terminal and is integrally formed with the connection body, the electronic device has a main current path flowing through the second main terminal, the conductive layer, the electronic element, the head part and the first main terminal, and a sensing current path flowing through the front surface of the electronic element, the head part and the sensing terminal.

2. The electronic device according to claim 1, wherein the first main terminal is connected to the connection body, and the first main terminal and the connection body are integrally formed.

3. The electronic device according to claim 1, wherein the conductive layer comprises a first conductive layer and a second conductive layer, wherein the electronic element is provided on the first conductive layer, the first main terminal is provided on the second conductive layer, and the connection body has a proximal end part connected to the second conductive layer.

4. The electronic device according to claim 1, wherein the sensing terminal is connected to the connection part, and the sensing terminal and the connection part are integrally formed.

5. The electronic device according to claim 1, wherein the electronic element has a withstand voltage structure, the connection body has an avoidance part, formed integrally with the head part, for avoiding contact with the withstand voltage structure.

* * * * *